(12) United States Patent
Schober et al.

(10) Patent No.: US 10,403,526 B2
(45) Date of Patent: Sep. 3, 2019

(54) SUBSTRATE STORAGE AND PROCESSING

(71) Applicant: MURATA MACHINERY, LTD., Kyoto-shi, Kyoto (JP)

(72) Inventors: Thomas Schober, Ermatingen (CH); Bernd Rahrbach, Constance (DE); Christian Wohanka, Tägerwilen (CH); Yves Fenner, Berg (CH); Gerhard Dovids, Grabs (CH)

(73) Assignee: MURATA MACHINERY, LTD., Kyoto (JP)

( * ) Notice: Subject to any disclaimer, the term of this patent is extended or adjusted under 35 U.S.C. 154(b) by 185 days.

(21) Appl. No.: 15/635,263

(22) Filed: Jun. 28, 2017

(65) Prior Publication Data
US 2017/0372930 A1    Dec. 28, 2017

Related U.S. Application Data

(60) Provisional application No. 62/355,856, filed on Jun. 28, 2016.

(51) Int. Cl.
*H01L 21/673* (2006.01)
*H01L 21/687* (2006.01)

(52) U.S. Cl.
CPC .. *H01L 21/67346* (2013.01); *H01L 21/67383* (2013.01); *H01L 21/6875* (2013.01); *Y10S 414/135* (2013.01)

(58) Field of Classification Search
CPC ......... H01L 21/67346; H01L 21/67383; H01L 21/6875
See application file for complete search history.

(56) References Cited

U.S. PATENT DOCUMENTS

| | | | | |
|---|---|---|---|---|
| 7,530,462 B2* | 5/2009 | Yajima | ............. | H01L 21/67346 206/303 |
| 7,588,150 B2* | 9/2009 | Kasama | ............ | H01L 21/67346 206/303 |
| 7,819,252 B2* | 10/2010 | Kasama | ............ | H01L 21/67346 206/509 |
| 7,854,327 B2* | 12/2010 | Hyobu | ............. | H01L 21/67294 206/454 |
| 8,480,348 B2* | 7/2013 | Hyobu | ............. | H01L 21/67778 206/509 |
| 8,960,442 B2* | 2/2015 | Oyama | ............. | H01L 21/67383 206/711 |
| 9,144,901 B2* | 9/2015 | Yang | ........................ | B25H 3/00 |
| 9,181,633 B2* | 11/2015 | Jurisch | .................... | C30B 29/40 |
| 9,324,763 B2* | 4/2016 | Matsuda | ........... | H01L 21/67346 |

(Continued)

*Primary Examiner* — Kaitlin S Joerger
(74) *Attorney, Agent, or Firm* — Keating & Bennett, LLP

(57) ABSTRACT

The system, method and apparatus described relates generally to a device related to substrate storage and processing. In one example embodiment to methods, apparatus, and systems of a substrate storage and processing module improving upon existing devices used in one or more instances for substrate transportation, sorting, and cleaning. The single piece design system may contain and support substrates in a method, reducing strain on its contents by utilizing an innovative support system without the use of standard clamping techniques and, in this or other iterations, such stacking methods may minimize chaffing of surfaces. Thus the device is vastly improved in its ability to preserve pristine conditions of contained substrates.

19 Claims, 11 Drawing Sheets

(56) References Cited

U.S. PATENT DOCUMENTS

| | | | |
|---|---|---|---|
| 9,437,466 B2* | 9/2016 | Sakiya | H01L 21/67265 |
| 2005/0188923 A1* | 9/2005 | Cook | C23C 16/4584 |
| | | | 118/728 |
| 2008/0298935 A1* | 12/2008 | Lering | H01L 21/67383 |
| | | | 414/217.1 |
| 2017/0372930 A1* | 12/2017 | Schober | H01L 21/67346 |
| 2018/0211860 A1* | 7/2018 | Kuo | H01L 21/67766 |
| 2018/0240696 A1* | 8/2018 | Yoo | H01L 21/02 |
| 2018/0374731 A1* | 12/2018 | Woo | B65D 85/38 |

* cited by examiner

SUBSTRATE STORAGE AND PROCESSING

This application claims priority from at least US Provisional Patent Application 62/355,856, filed on Jun. 28, 2016, and entitled "Substrate Storage and Processing".

FIELD OF TECHNOLOGY

This disclosure relates generally to substrate storage and processing. In one example embodiment, to methods, apparatus, and systems of an improved substrate storage and processing module, which may relate specifically to substrate storage, processing and sorting.

BACKGROUND

Since the introduction of the 300-mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they are clamped in place by fins and held for later use. Yet FOUPs today are hampered by methods and system designs which may contaminate their contents, chafe wafers, and delay loading and unloading of substrate wafer contents as a result of multifarious construction. Thus, there may be a need for an invention that more efficiently and accurately accomplishes the desired tasks of FOUPs.

Current substrate storage devices allow contained wafers to be cleaned with undirected, pressurized liquids, gases, and/or other substances. Yet FOUPs have been deemed vulnerable to the haze effect, whereby these undirected substances may provide inadequate cleaning, unable to target unwanted particulate matter. Due to typical FOUP construction, individual substrates, contaminated or otherwise, may not be removed due to immovability in clamping apparatuses. Thus, it has become standard to replace FOUPs several times during wafer processing in a Front-End Factory. But the creation of an alternative device with streamlined or improved cleaning methods may present itself as a key tool in the semiconductor industry, saving both time and energy without the need for replacement at such a quick rate.

Recent, rapid advances in technology have necessitated the creation of new devices to cope with the increasing demand for pacing in economies of scale. Yet due to non-recurring engineering, or the one-time costs in research and development of products, and time to market concerns, it may be considered implausible to base new designs on existing devices. Accordingly, economies of scale may only be achieved in the semiconductor product industry with manufacturing orders and shipments in high volume. Further, because repair of completed products may be considered impractical, incorporation of reliability and flexibility at the production stage has become imperative. Substrate storage devices directly affect these values, as reliability of semiconductor products depend on assembly, use, and environmental conditions at these crucial stages. Thus, improvements in substrate storage devices are correlated with productivity of semiconductor manufacturing.

Currently marketed substrate storage devices are affected by a number of reliability issues, including but not limited to mechanical stress, dust contamination, pressures, and temperature vulnerability. Prior substrate storage systems may be equipped with fins with which to hold wafers in place. Such fins clamp the wafers, which may be 100-200 micrometers thin and vulnerable to friction from other surfaces, and cause unnecessary chafing along both surfaces of the substrate. Prior substrate storage devices, in multiple iterations being of varying levels, are subject to extreme levels of mechanical pressure loads and accelerate replacement times with multiple stress points along the conductive surfaces of the device, produced in multiple parts in multiple iterations. These prior devices have proven unsatisfactory for certain applications in that they contain unnecessary gaps as a result of construction methods and provide a rigid, inflexible structure which may exist in excessive sizes, decreasing packing capacities in material transport systems.

Issues with prior substrate storage devices are exacerbated with construction sizes of typical FOUPs, which may be produced in multiple stages of multiple parts, typically holding a maximum of 25 wafer of 300 mm wafer fabs and device heights of upwards of 330 mm. Recalling that high volume shipments are imperative, the size of these FOUPs hamper scaling efforts and diminish efficiency by requiring the construction of the storage FOUPs in steps and parts, especially if smaller sized containers may be created to contain the same volume of substrate. Thus, a substrate storage device which streamlines construction processes may increase efficiency of creation, storage and ease of replication in the manufacturing process.

Because preservation of held substrate wafer quality may be the primary goal of such storage devices, an improved substrate storage device must allow for cleaning of contents without sacrificing the structural integrity of the system or the wafers themselves. Innovative flexible applications, such as the ability to remove a single substrate stack or module may therefore grant improved stacking, removing, and tracking over current storage devices like FOUPs.

It may be therefore an object of this invention to provide a device which may be used for substrate or wafer containment, transportation, and holding in semiconductor manufacturing or like processes. Another object of the invention may be to provide a storage device of single piece design with single material utilizing a system of alternating substrates and supporting rest latches. Another object of the invention may be to provide controllable buffer storage purge options which may be directional laminar gaseous flows across the contained substrates. Another object of the invention may be to provide self-centering device capabilities and substrate orientation capabilities which may allow for replacement of substrate stacks and/or modules.

SUMMARY

Disclosed are methods, apparatus, and systems that provide a substrate holding device with improved features.

The present invention describes a substrate holding device for use in manufacturing, processing or storage among other fields. In a preferred embodiment, the substrate holding device may be a storage or stocker, such as a long-term storage, short-term storage or a buffer. The substrate holder may be improved over the prior art in order to reduce contamination, damage and to provide for a higher quality substrate to other processes, device and uses.

The substrate holder may include multiple modules. Each module may include the ability for at least one substrate to be held by the module. The substrate may be held in a method wherein the substrate may be not clamped, or otherwise pressure exerted on the substrate.

The disparate modules may have substrate holding arms that extend into the center of an interior recess of the module, such that the module may hold the substrate via the substrate holding arms. The arms may have an arch design, with notch on the inward side of the arch, wherein the notch angles downward in relation to the substrate. The angled notch then may allow the substrate to be placed on the arms, such that the substrate may be held by the arms, and rests on the arm, but the contact patch may be limited to be as small as possible to reduce the impact on the held substrate. Additionally, the angle may position the contact patch to be on the extreme end of the substrate, such that the top surface and the bottom surface of the substrate are protected from contamination and damage. As well as this, the angled arms help to self-center the substrates in the arms, such that the downward angle of the arms, forces the substrate to fall into the position of the arms, of which may be any plurality, but in a preferred embodiment, are of four on each diagonal side of a square substrate module.

The substrate holder, wherein the substrate holder includes disparate modules, may be designed to reduce the amount of contamination, chaffing and otherwise damage to the substrates, and internal environment of which contacts the substrates. The modules then may be made via a single piece design, such that the module may be made by a seamless process, wherein the single piece design minimizes chafing and contaminant propagation through the environment, of which may contact the substrates.

The substrate modules, wherein the substrate holder includes disparate modules, may be designed such that the modules may be stacked to form the substrate holder, in that the modules stacked, may store a plurality of substrates, wherein each module stacked includes at least one substrate. The stacked substrates may be isolated by the modules from the ambient environment, and allow for an internal environment. The internal environment may then, via an upper and lower cap piece, and the stacked modules in between, provide for a gas, such as a forced air to contact the substrates in a laminar fashion throughout the substrate stack, such that the substrates may be treated, or kept free from contamination or damage, of which includes entering a gas into the holder, of which propagates throughout the modules and over each substrate, via recesses and channels.

The modules may, themselves, include recesses and notches, wherein each module may notch into the above and below module, such that the modules when stacked may aid in stopping the stack from falling for any reach. The notches, may also include means, such as ports, for transferring gas, air, or data between modules, such that the air may propagate through each module, and then to each substrate.

The substrate modules, wherein the substrate holder includes disparate modules, may be designed such that the modules may allow for easier loading and unloading of each module, or module with substrate, or just the individual substrates. Additional abilities include the reduced contamination source, and the ease of cleaning given by the modular design, as well as the other features such as the single piece design for reduced chaffing. Auxiliary abilities into the reduced production steps, and reduced friction and contact patch between the susurrates and the module structures. This also includes the ability for the substrates, modules, and holders to have sensors and data tracking to provide for efficient transfer, tracking and propagation of substrates and modules in the holder or holders, as well as exterior systems and devices, such as on an assembly line.

The methods and systems disclosed herein may be implemented in any means for achieving various aspects. Other features and embodiments will be apparent from the accompanying drawings and from the detailed description that follows.

BRIEF DESCRIPTION OF THE DRAWINGS

Example embodiments are illustrated by way of example and are not limited to the figures of the accompanying drawings, in which, like references indicate similar elements.

Figure 1:
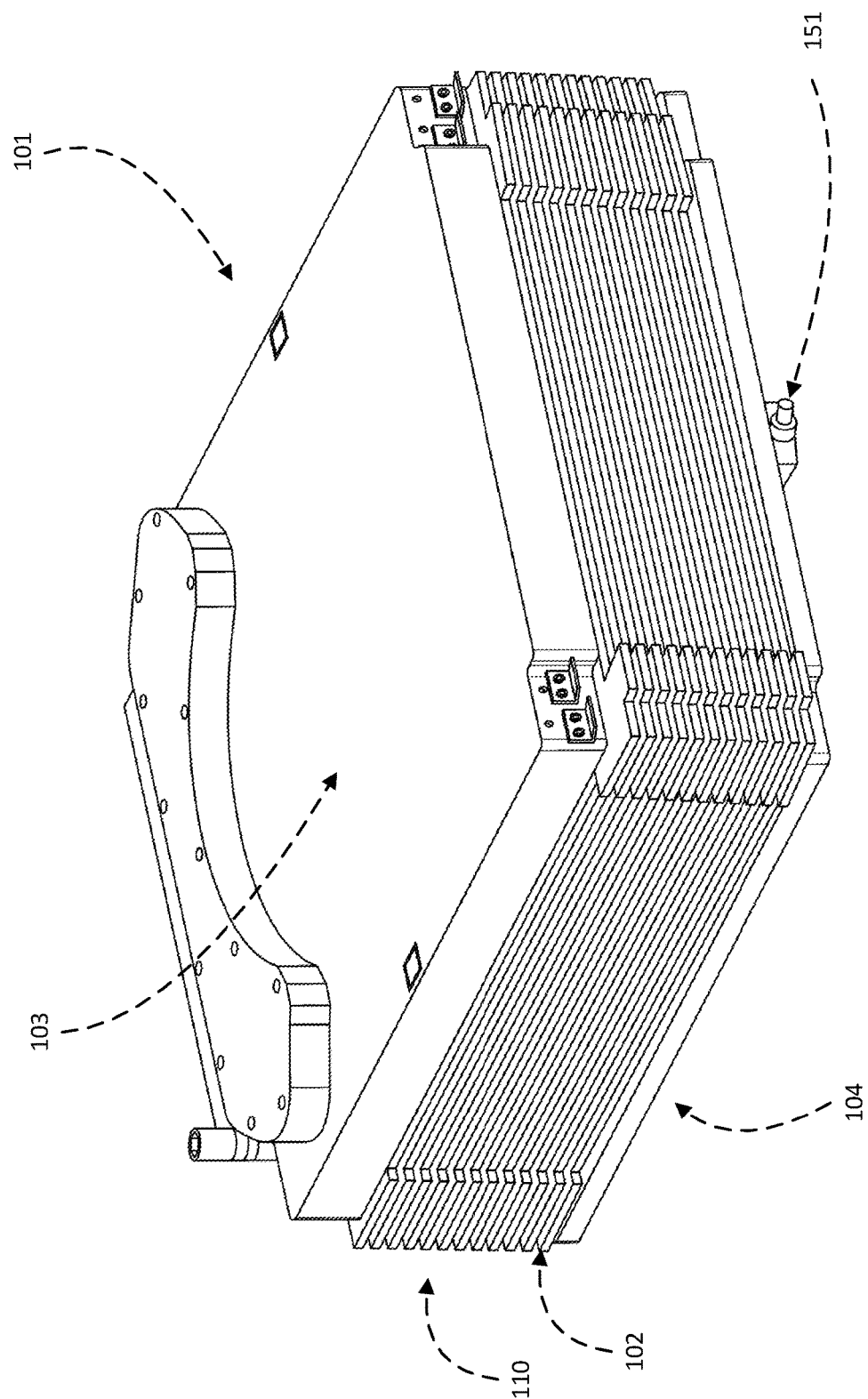
FIG. 1 may be a perspective view one embodiment of the present invention substrate holder with multiple modules.

Other features of the present embodiments will be apparent from the accompanying drawings and from the detailed description that follows.

DETAILED DESCRIPTION

Disclosed are methods, apparatus, and systems that may provide for a substrate storage and purging device.

In a preferred embodiment, of which the features may be combined with any other embodiments wherein the device may describe a substrate storage and processing device.

In one example embodiment, of which may be in addition to any other embodiments, to a substrate holder.

In one example embodiment, of which may be in addition to any other embodiments, to a substrate storage.

In one example embodiment, of which may be in addition to any other embodiments, to a substrate stocker.

In one example embodiment, of which may be in addition to any other embodiments, to a substrate storage device.

In one example embodiment, of which may be in addition to any other embodiments, to a substrate processor and associated machinery and systems.

In one example embodiment, of which may be in addition to any other embodiments, to a substrate processor device.

In one example embodiment, of which may be in addition to any other embodiments, to a substrate sorting and storage device, wherein the substrates are able to be processed.

In one embodiment, of which may be in addition to any other embodiments, to a substrate holder, wherein the substrate holder may be made of at least one module.

In one embodiment, of which may be in addition to any other embodiments, to a substrate holder, wherein the substrate holder may be made of at least one module, wherein each module holds one or more substrates.

In one embodiment, of which may be in addition to any other embodiments, to a substrate holder, wherein the substrate holder may be made of at least one module, wherein each module holds one substrate.

In one embodiment, of which may be in addition to any other embodiments, to a substrate holder, wherein the substrate holder may be made of at least one module, wherein the modules may be stacked to create a multi-substrate holder.

In one embodiment, of which may be in addition to any other embodiments, to a substrate holder, wherein the substrate holder may be made of at least one module, wherein each respective module may be respectively made in a single piece design.

In one embodiment, of which may be in addition to any other embodiments, to a substrate holder, wherein the substrate holder may be made of at least one module, wherein the modules may be respectively made in a single piece design of a single material.

In one embodiment, of which may be in addition to any other embodiments, to a substrate holder, wherein the substrate holder may be made of at least one module, wherein the modules may be respectively made such that the workpiece produces less contamination sources.

The single piece design, as well as single material, and other features as listed in the embodiments, may reduce the amount of contamination to the substrate, such that because the single piece design, there are less seams or flaws on the workpiece as well as less production steps, such that there may be less potential for debris or otherwise, for the workpiece to contaminate the workpiece.

In one embodiment, of which may be in addition to any other embodiments, to a substrate holder, wherein the substrate holder may be made of at least one module, wherein the modules may be respectively made such that the single piece and single material design allows for easier cleaning of the modules, substrates or substrate holder as a whole.

In one embodiment, of which may be in addition to any other embodiments, to a substrate holder, wherein the substrate holder may be made of at least one module, wherein the modules may be respectively made such that the single piece and single material design may allow for ease of unloading and loading of the substrate from the module, or ease of unloading the module from a stacking location or configuration.

In one embodiment, of which may be in addition to any other embodiments, to a substrate holder, wherein the substrate holder may be made of at least one module, wherein the modules may be respectively made in a single piece design and single material may reduce the production steps necessary for production of the workpiece.

In one embodiment, of which may be in addition to any other embodiments, to a substrate holder, wherein the substrate holder has disparate modules, wherein each module holds one substrate wafer.

In one embodiment, of which may be in addition to any other embodiments, to a substrate holder, wherein the substrate holder holds one substrate in a non-clamping method.

In one embodiment, of which may be in addition to any other embodiments, to a substrate holder, wherein the substrate holder holds one substrate in a clamping method.

In one embodiment, of which may be in addition to any other embodiments, to a substrate holder, wherein the substrate holder holds one substrate in a non-clamping method such as the substrate wafer rests on the holder module.

In one embodiment, of which may be in addition to any other embodiments, to a substrate holder, wherein the substrate holder may be made of at least one module, wherein the modules may be respectively able to self-center the substrates within each module holder.

In one embodiment, of which may be in addition to any other embodiments, to a substrate holder, wherein the substrate holder may be made of at least one module, wherein the holder, the module, the substrate being held, or any other structure may be rotated.

In one embodiment, of which may be in addition to any other embodiments, to a substrate holder, wherein the substrate holder may be made of at least one module, wherein the holder, the module, the substrate being held, or any other structure may be rotated.

In one embodiment, of which may be in addition to any other embodiments, to a substrate holder, wherein the substrate holder may be made of at least one module, wherein the holder, the module, the substrate being held, or any other structure may be rotated at any time during storage, such as before the module or substrate may be stored in place, while the module or substrate may be being moved, or after the substrate or module may be stored in place.

In one embodiment, of which may be in addition to any other embodiments, to a substrate holder, wherein the substrate holder may be made of at least one module, wherein the holder, the module, the substrate being held, or any other structure may be rotated such that the substrate, module, or structures are positioned for ease of removal, entry, storage, cleaning, or any other use.

In one embodiment, of which may be in addition to any other embodiments, wherein any aforementioned or later mentioned of rotated may also interchangeable or replaced with a similar meaning or action such as to being turned, spun or any reoriented. It may be also noted that the module, substrate, or any other structure may be flipped or turned.

In one embodiment, of which may be in addition to any other embodiments, to a substrate holder, wherein the substrate holder may be made of at least one module, wherein the module or substrate may be rotated, spun or otherwise moved or changed in direction or position when stacked, or placed in the present invention, or at any point in processing or storage, such as before or after being place in the present invention.

In one embodiment, of which may be in addition to any other embodiments, to a substrate holder, wherein the substrate holder may be made of at least one module, wherein the modules may be respectively are able to secure the substrate within each module, wherein the module may be able to secure the substrate from any unintended force, whether it be from movement of the module or modules, machinery, earthquake, or other forces without claiming or otherwise enlisting pressure on the substrate, of which the lack of pressure may provide for less chafing, contamination or damage to the substrate.

In one embodiment, of which may be in addition to any other embodiments, to a substrate holder, wherein the substrate holder may be made of at least one module, wherein the modules may be designed to provide for minimization of contact between the module and substrate.

In one embodiment, of which may be in addition to any other embodiments, to a substrate holder, wherein the substrate holder may be made of at least one module, wherein the modules may be designed to provide for minimization of contact and wherein the contact between the module and substrate may be minimize substantially a side of the substrate and may be not on the substrate face, such that the substrate holder does not contaminate or otherwise degrade the substrate face.

In one embodiment, of which may be in addition to any other embodiments, to a substrate holder, wherein the substrate holder may be made of at least one module, wherein the modules may be respectively made in a single piece design of one material.

In one embodiment, of which may be in addition to any other embodiments, to a substrate holder, wherein the substrate holder may be made of at least one module, wherein the modules may be respectively made in a single piece design of more than one material.

In one embodiment, of which may be in addition to any other embodiments, to a substrate holder, wherein the substrate holder may be made of at least one module, wherein the modules may be respectively made a plurality of pieces and materials.

In one embodiment, of which may be in addition to any other embodiments, to a substrate holder, wherein the substrate holder may be made of at least one module, wherein the modules structure may be made of one material, and control, movement or sensor surfaces or devices are attached to the single piece and material design.

In one embodiment, of which may be in addition to any other embodiments, to a substrate holder, where the substrate holder may be made of at least one module, wherein the module may be of any shape, such that the module may hold or support a single substrate.

In one embodiment, of which may be in addition to any other embodiments, to a substrate holder, where the substrate holder may be made of at least one module, wherein the module may be of any shape, such that the module may hold or support at least a single substrate, such as more than one substrate.

In one embodiment, of which may be in addition to any other embodiments, to a substrate holder, where the substrate holder may be made of at least one module, wherein the module may be of any shape, such that the module may hold or support a single substrate, wherein the substrate may be of any shape, such as a standard 300 mm circular substrate, or any other substrate or product.

In one embodiment, of which may be in addition to any other embodiments, to a substrate holder, where the substrate holder may be made of at least one module, wherein the module may be of any shape, such that the module may hold or support a single substrate, wherein the holder structure allows for the placement of a substrate, and wherein the holder self-centers the substrate, such that the substrate may be secure in the holder.

In one embodiment, of which may be in addition to any other embodiments, to a substrate holder, where the substrate holder may be made of at least one module, wherein the module may be of any shape, such that the module may hold or support a single substrate and wherein the holder may be made of multiple module, such that an incorporated, or separate device may stack the module, of which may be holding a substrate. It may be noted that the holders may be designed by any method to interlock or otherwise aid in stacking, securing, and guiding the above or below holder such that they stack.

In one embodiment, of which may be in addition to any other embodiments, to a substrate holder, where the substrate holder may be made of at least one module, wherein the module may be of any shape, such that the module may hold or support a single substrate and wherein the holder may be made of multiple modules, such that an incorporated, or separate device may stack the module, of which may be holding a substrate. It may be additionally noted that in each disparate module, the substrate or product to be held, stored or manipulated may self-center to within the module as mentioned above and below in this disclosure of which may include any method, such as self-guiding pins which may guide the substrate or product to be centered on the module, or specifically in a preferred embodiment where guides may include a sloping structures, such that the substrate or product may fall or routinely and naturally self-center within the module holder.

In one embodiment, of which may be in addition to any other embodiments, to a substrate holder, where the substrate holder may be made of at least one module, wherein the module may be of any shape, such that the module may hold or support a single substrate and wherein the holder may be made of multiple modules wherein the multiple modules are stacked within the present invention and wherein then the multiple modules self-center or self-align when stacked.

In one embodiment, of which may be in addition to any other embodiments, to a substrate holder, where the substrate holder may be made of at least one module, wherein the module may be of any shape, such that the module may hold or support a single substrate and wherein the holder may be made of multiple modules wherein the multiple modules are stacked within the present invention and wherein then the multiple modules self-center or self-align when stacked actively or passively.

In one embodiment, of which may be in addition to any other embodiments, to a substrate holder, where the substrate holder may be made of at least one module, wherein the module may be of any shape, such that the module may hold or support a single substrate and wherein the holder may be made of multiple modules wherein the multiple modules are stacked within the present invention and wherein then the multiple modules actively self-center or self-align when stacked such as the stack modules including electronic, IR, RFID, laser, or any other active indicators to either provide to the mechanism, or to the mover when the stack may be aligned or self-centered or to provide for feedback for the movement mechanism to adjust to center the stack.

In one embodiment, of which may be in addition to any other embodiments, to a substrate holder, where the substrate holder may be made of at least one module, wherein the module may be of any shape, such that the module may hold or support a single substrate and wherein the holder may be made of multiple modules wherein the multiple modules are stacked within the present invention and wherein then the multiple modules passively self-center or self-align when stacked.

In one embodiment, of which may be in addition to any other embodiments, to a substrate holder, where the substrate holder may be made of at least one module, wherein the module may be of any shape, such that the module may hold or support a single substrate and wherein the holder may be made of multiple modules wherein the multiple modules are stacked within the present invention and wherein then the multiple modules passively self-center or self-align when stacked through any method, but notably via interlocking structures such as structures between the modules which key into each other, or wherein the bottom and top of each module structure have extrusions or otherwise have an extrusion enter a recess of the adjacent or above or below module, wherein the two modules are guided or centered in the desired position. It may be additionally noted that also, the module may self-center themselves also via other passive methods such as sloped guide rails, or external passive or active elements, such as the present invention providing for guide rails that the modules are slid down or across, such that the rails themselves either center the structure, or notches or other aspects of the rails, such as bumps or stops provide for the self-centering or aligning actively or passively.

In one embodiment, of which may be in addition to any other embodiments, to a substrate holder, where the substrate holder may be made of at least one module, wherein the module may be of any shape, such that the module may hold or support a single substrate, wherein each module may be able to self-center on the corresponding below or above module.

In one embodiment, of which may be in addition to any other embodiments, to a substrate holder, where the substrate holder, wherein the module may be removed from the stack by a mechanism, disparate, or part of the holder structure. This may be by any design or method, such as a swing arm, but also may be elevator style mechanism, etc. The movement may simply remove the substrate form the holder, but also may remove the holder itself, along with the substrate, or empty from the stack.

In one embodiment, of which may be in addition to any other embodiments, to a substrate holder, where the disparate modules, and holder include sensors, control surfaces and mechanisms, such that are network, connected, valve operated, electrically operated, or operated by any method, such that they may sense any status of the substrates. This may include, but may be not limited to whether substrates are present in each module, how many modules are stacked, contaminant sensors, air flow sensors, temperatures sensors, and any other sensors. The control sources may be of any kind such as valves or which may control air flow, arms to move substrates, electrical mechanism to move holders, etc. The sensors, and control surface may be connected to a processing unit, manual controls, or local or remote network, or any other device or method, wherein the unit may be operated, either by a user, by a computer, or automatically, or to provide for actions, such as positioning a substrate, or otherwise tracking, or providing for the substrate, such as using airflow to clean a substrate, or ready a substrate for removal.

In an embodiment, of which may be in addition to any other embodiments, to a substrate holder, the module or individual product being held such as a substrate or substrate wafer may be accessible from all sides, as well as below and above when in any configuration.

In an embodiment, of which may be in addition to any other embodiments, to a substrate holder, the module or individual product being held such as a substrate or substrate wafer may be accessible from all sides, as well as below and above when in any configuration, such as when the modules are stacked.

In an embodiment, of which may be in addition to any other embodiments, to a substrate holder, the module or individual product being held such as a substrate or substrate wafer may be accessible from all sides, as well as below and above when in any configuration such that the movement mechanisms may remove the module or individual substrate from any side of the module or present invention. An example can be that the substrate can be unloaded from any of the side, such as a far side of the substrate module and present invention stacked modules, such that depending on the opening mechanisms, final destination point, or for any other reason, the substrate or module may be removed, loaded, unloaded or entered into the present invention from any direction.

In an embodiment, of which may be in addition to any other embodiments, to a substrate holder, the module or individual product being held such as a substrate or substrate wafer may be accessible from all sides, as well as below and above when in any configuration or direction depending on destination point or any characteristic, such as space limitations or orientation of the present invention in a factory line etc. and among others.

In one embodiment, of which may be in addition to any other embodiments, to a substrate holder, where the substrate holder may be for storage.

In one embodiment, of which may be in addition to any other embodiments, to a substrate holder, where the substrate holder may be for long-term or short-term storage.

In one embodiment, of which may be in addition to any other embodiments, to a substrate holder, where the substrate holder may be for storage, such as long term storage. In another embodiment, the present invention may be for short term storage, or for buffering storage.

In one embodiment, of which may be in addition to any other embodiments, to a substrate holder, where the substrate holder may be for processing, such as for decontamination.

In one embodiment, of which may be in addition to any other embodiments, to a substrate holder, where the substrate holder may be for storage with processing, such as the present inventions tearing substrates for any length of time, but also actively cleaning or processing the substrates, such as with air or forced gas.

In one embodiment, of which may be in addition to any other embodiments, to a substrate holder, where the substrate holder may in each individual module, or as a whole provide for a gas to interact with the substrates.

In one embodiment, of which may be in addition to any other embodiments, to a substrate holder, where the substrate holder may in each individual module, provide for a gas of which may interact with the substrate, such that the gas may be provided to the holder and through routing may be introduced to each module, such as through connecting or interlocking cavities within each module, such that gas, such as a forced air may be provided to each module, and the recesses within each module provides air onto each substrate, reducing contamination or removing contamination. The gas may be of any type such as forced ambient air, heated or cooled air, or another gas such as pure nitrogen, or another inactive or benign gas. The gas may also provide for an effect, such as heated gas, or may be of an element or have additives, which help to provide for a function such as clean or degas the substrates.

In one embodiment, of which may be in addition to any other embodiments, to a substrate holder, where the substrate holder may in each individual module, or as a whole provide for a gas to interact with the held substrates, and wherein in each module the gas may be provide in a laminar function.

In one embodiment, of which may be in addition to any other embodiments, to a substrate holder, where the substrate holder may in each individual module, or as a whole provide for a gas to interact with the held substrates.

In one embodiment, of which may be in addition to any other embodiments, to a substrate holder, where the substrate holder may in each individual module, teaches to a structure, such that the substrate may be held with as little contact as possible between the substrate and module. In one embodiment, there may be any plurality of arms and points, wherein the substrate may rest or be held on the holder. In one example embodiment arms may diagonally project into the interior of the holder, such that the arms hold the substrate. The arms may form an upward arch, such at the top of the arch a notch extrudes, of which the substrate may be held or placed on the notch, such that the notch may be angled in a fashion, wherein the substrate only contacts the arch in a small contact patch.

In one embodiment, of which may be in addition to any other embodiments, to a substrate holder, where the substrate holder includes disparate modules, wherein the disparate modules are stacked, and wherein the modules may be stacked there may be a gas flow, such as an air flow of which may be laminar or even across all of the modules, substrates and throughout the present invention. The air flow may then be designed as a specific point of entry, and exit, as well as internal flow such that the substrates may be cleaned, processed or otherwise modified by the air flow, such as for drying, or for simple dust or particulate cleaning or management.

In one embodiment, of which may be in addition to any other embodiments, to a substrate holder, where the substrate holder includes disparate modules, wherein the disparate modules are stacked, and wherein the modules may be stacked there may be a gas flow, such as an air flow wherein the air enters a gas inlet, and wherein the gas then enters an inlet gas distribution channel, such as on the side of the present invention, wherein then the gas may be distributed evenly through a laminar flow throughout the modules, such that the gas interacts with each substrate evenly, and a then may gas enter an outlet gas distribution channel, which then leads the gas to exit the present invention. It may be also noted that the gas may recirculate at least one time within the present invention before exiting or entering the outlet gas distribution channel in some embodiments. It may be also noted that the inlet gas distribution channel, may be of any type, or be referred to by alternative names, but may be noted to collectively provide for an ability for the inlet gas to permeate within the structure to provide a laminar flow. The outlet gas distribution channel may also be of any type or referred to by alternative names, but may be noted to collectively provide for an ability of the gas to collect from the structure after being used and to be removed from the structure, along with contaminates, etc., to be reused recycled, processed or otherwise. It may be also noted that the gas distribution channel may have features such as debris traps, screen, filters, heaters, etc. It may be noted that seals either separately, or via between the structures of the modules, or via within the entire present invention structures, may allow the air to be guided under pressure of by volume to travel from an inlet and outlet. It may be also noted that the direction, and placement of the inlet and outlet may in any embodiment may be in any location, and may be purposefully designed, such as an inlet on the top of the present invention structure, and an outlet on the bottom, such that in the outlet gas distribution channel, particulate matter may fall into a recess trap, or such that the particular matter may be evacuated with the gas flow, and such that the gas may also be later filtered, reused, recycled or otherwise processed.

It may be also noted that the gas may be of any type, and may be heated, cooled or otherwise processed, as well as being ambient air, or any other type of gas.

In one embodiment, of which may be in addition to any other embodiments, to a substrate holder, where the substrate holder includes disparate modules, wherein the disparate modules are stacked, and wherein the modules may be stacked or entered into the present invention via a conveyer, arm or any other mechanism. It may be noted that this mechanism may include arms or manipulators to move the modules or the substrates on any end of the present invention, and may include articulating arms, conveyors or any other method, and of which the arms or conveyors may include the ability to slide across, or up and down the stack of modules and substrates such that the individual substrates may be moved, the individual modules may be moved or a partial stack of modules, or full stack of modules may be moved. It may be also noted that there may be multiple manipulators, both on different locations, but also on the same side, slide or movement mechanism such that the modules may be moved up or down, such that another manipulator may interact with a specific substrate or module.

In one embodiment, of which may be in addition to any other embodiments, to a substrate holder, where the substrate holder includes disparate modules, wherein the disparate modules are stacked, and wherein the modules may be stacked or entered into the present invention via an external opener, manipulator, arm or other device. This may be noted that the external opener may be automatic, in that the device may open the module to access the product, such as the substrate automatically, or may automatically open the module from the exterior, such that a buffer storage, or conditioning tower may be able to fill individual modules with substrates after being processed, or for other reasons, such as extracting product such as the substrate for use or use in manufacturing as well as provide for avenues or recesses for the gas passages to provide entry to the substrates in each module, or multiple modules.

In one embodiment, of which may be in addition to any other embodiments, to a substrate holder, where the substrate holder includes disparate modules, and wherein the module structure allows for ease of removal, accessing or otherwise altering or moving the substrates held.

In one embodiment, of which may be in addition to any other embodiments, to a substrate holder, where the substrate holder includes disparate modules, and wherein the module structure allows for easy removal of a disparate module, substrate, or plurality of disparate modules or substrates, of which are stacked, form the stack.

In one embodiment, of which may be in addition to any other embodiments, to a substrate holder, where the substrate holder includes disparate modules, and wherein the module structure allows for ease of removal such as via a mechanism or mechanical drive, such as an elevator mechanism, arm mechanism or other mechanism such that the substrate holder, or substrates are able to be repositioned into the stack or presented to an outside device, such as to remove the substrate or substrate module, such that the substrate or substrate module may be placed in an assembly line or used by another device, such as a substrate manufacturing device. In addition, the mechanism may be able to accept a substrate or substrate with substrate module into the holed, such as to store, or to keep the substrate in a clean environment for any given period of time, in storage, or in an assembly line.

In a preferred embodiment, the present invention provides a substrate manufacturing, processing or transfer system wherein a substrate handling system made of one or more holders or modules such that the holders or modules may be stackable. In the present invention embodiment, the modules may then have one or more holding arms that extend into a center interior recess of the holder such that that the holder hold a substrate via the holding arms. These arms may hold one substrate each and such that there may be a separation between each substrate when stacked.

It may be noted that the holders, arms and notches may be formed from one single piece or single piece of material, such that there may be an ease of production, but also there may be advantages such as the single piece reduces contamination due to chaffing etc.

Additionally, the substrates held by the holders are not clamped or have pressure exerted by the holders or the arms, such as to reduce chaffing and damage to the substrates. For example, there are four arms on each diagonal side of a square substrate holder, for which the substrate may then rest on the arms and notches. An example may be wherein the holding arms may have an angled arch design with a notch on the inward side of the arch, wherein the notch may angle downward in relation to the substrate and wherein the angled notch allows the substrate to be placed on the arms such that the substrate may be held by the arms and rests on the notch, making the smallest contact patch. This may also provide for an inherent ability to wherein the angled arms position the contact patch to be on the extreme end of the substrate and that angled arms or notches allow the substrate to self-center on the arms.

It may be noted that there may be a barrier between each holder such that each substrate may be separated or isolated form the above or below in each stack in case of breakage or contamination.

The present invention may provide as well wherein the holder or module may include recesses and extrusions or notches, wherein the extrusions of one holder key into the above holder recesses, such that the multiple holders when stacked are aided in stopping the stack from falling or misaligning and such that wherein the holders self-center or self-align when stacked.

It may be noted the above holders with the substrates when single or stacked may be housed in a container or compartment, isolated from the environment internal to the manufacturing, processing or transfer system or the exterior ambient environment.

Additionally, forced gas may be fed through recesses in the holders and a compartment or container which may be able to contact the substrates in a laminar fashion throughout the substrate and holder stack, such that the substrates are treated, or kept free from contamination or damage.

In an embodiment, the substrates and holders have sensors and associated data tracking abilities to provide for efficient transfer, tracking and propagation of substrates and holders, as well as exterior systems and devices, such as on an assembly line.

It is noted that the present invention may then be provided to be a high-density replacement or augmentation to already existing systems and transfer mechanisms such as FOUP's but provide a higher density and improved abilities as aforementioned, and as names as a TecCell.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods are industry terms and may refer to similar alternatives. In addition, the components shown in the figures, their connections, couples, and relationships, and their functions, are meant to be exemplary only, and are not meant to limit the embodiments described herein.

FIG. 1 may be a perspective view of one embodiment of the present invention substrate holder with multiple modules.

FIG. 1 teaches to a substrate holder 101. The substrate holder may be made of at least one disparate modules, such as module 102. It may be noted that each disparate module 102, may hold at least one substrate. The modules 102 may be stacked as seen by stacked module 110, of which may include aforementioned module 102. The stacked modules, may also include a top module, or cap piece 103, of which may include mechanisms and recess, of which allow the substrates and modules, to be removed, as well as act as a plenum for processing gasses, or to keep the interior environment isolated from the ambient.

An example can be that each module, when stacked, seals the environment where the substrate may be held, from the ambient. With the top piece added then the entirety of the stacked modules and substrates are isolated from the ambient, and then additionally, gases or other treatment methods, such as heat, forced air or gas etc. may be introduced to the interior to treat or otherwise clean or store the substrates.

A bottom cap 104 may be used such that the cap provides a structure for the module stack 110 to be mounted or placed on, and provides for a similar ability of the upper cap to be able to isolate the interior environment from the exterior, such that the substrates and interior of the modules are isolated from the ambient. The bottom cap, may include a nozzle or connector 151, of which may be connected to a gas supply or return, such that the gas may be introduced to the interior environment, wherein the substrates interact or are treated, or aid for any reason by the gas. It may be noted that the gas nozzle 151, may be of any design or plurality, and may be on any side of the lower cap, but also the upper cap, or may be positioned on the side of the module stack. In a preferred embodiment, there may be two nozzles, such that one of the nozzles may be an entry nozzle for the gas and the other may be a return or waste nozzle. It may be also noted that the nozzles may bring in any gas, or other product, such a liquid, for any reason, and that the nozzles may be connected to other machine, or devices of which may treat, pressurize, or provide the gas or other products, and may be in any location.

Figure 2:
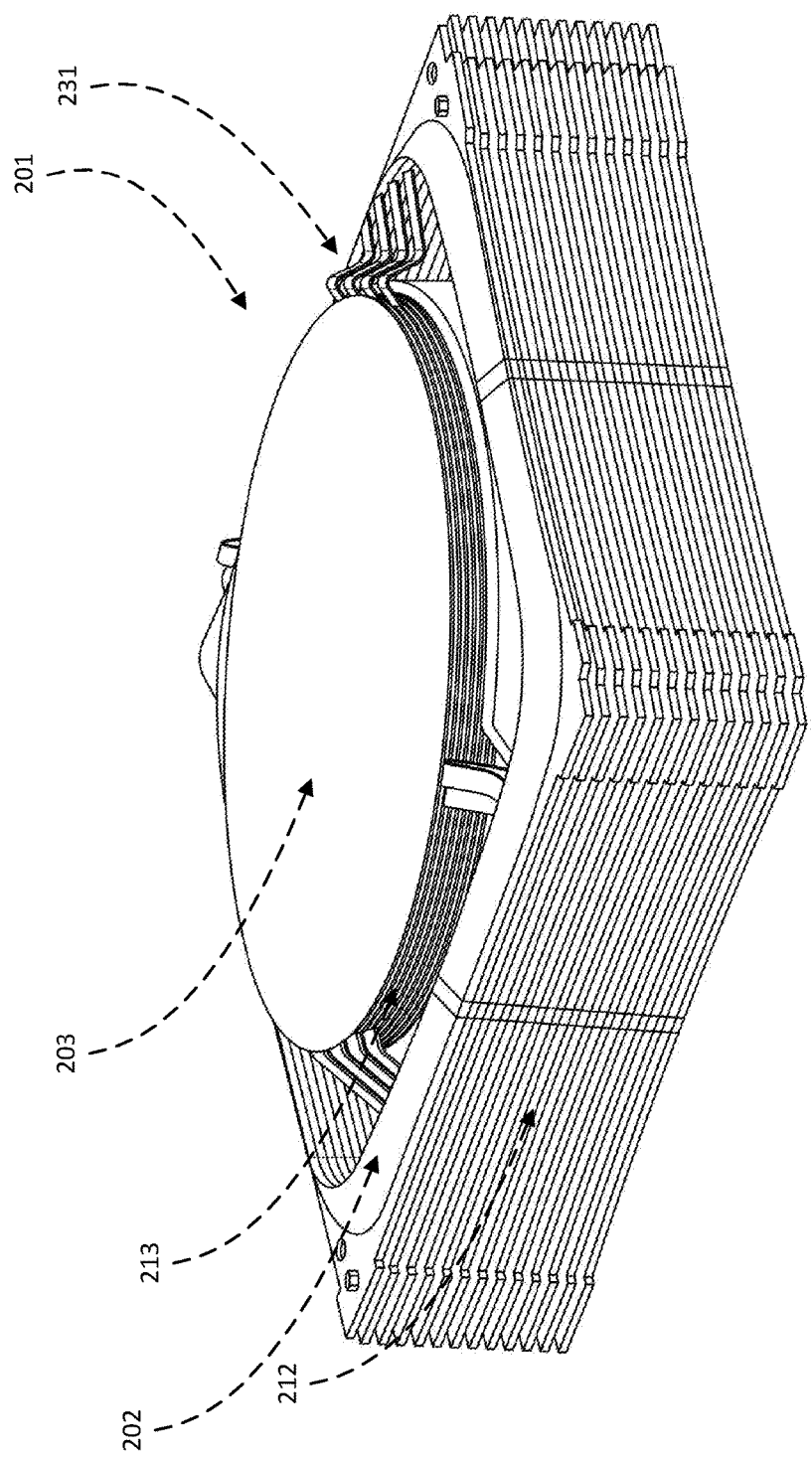
FIG. 2 may be a perspective view one embodiment of the present invention substrate holder with multiple modules with the upper cap removed.

FIG. 2 may be a perspective view one embodiment of the present invention substrate holder with multiple modules with the upper cap removed.

FIG. 2 teaches to a substrate holder 201 of which may have disparate modules 202 stacked, such as stacked modules 212. Each module may have a substrate, such as module 202 having a corresponding substrate 203, of which may be held by the substrates arm 231. It may be then noted that the stack of modules 212 includes stack of substrates 213, where each disparate module holds an individual substrate, via substrate holding arms. This may be exampled by the individual disparate module 202 holding the substrate 203, and then the stack of modules 212 holding stack of substrates 213. It may be noted that any plurality of substrates may be held, and in some embodiments, there may be empty modules in the stack, wherein the module does not hold a substrate. It may be also noted that the modules may have any number or plurality of arms, and that the arms may be of any design. Also, noted may be that the modules holding individual substrates may be designed as aforementioned and as pictured wherein each individual holder may be such that the stacked substrates and modules may be separated wherein they do not touch such that contamination may be limited.

Also, noted in alternative embodiments there may be between each module and substrate a barrier such that each substrate may be separated or isolated from the one above or below in a stack. The barrier may in some embodiments not be touching the substrates, and may provide a barrier such that in an instance where a substrate may be contaminated or wherein if a substrate cracks or breaks, material from the contaminated or broken substrates may not fall or contaminated other substrates, such that the substrates are isolated. The barrier may be seen to be made of a thin plastic film, but also may appreciably be metal, aluminum etc., or may be a screen or mesh. In some embodiments, the barrier may touch the substrates. The barrier may have also properties that limit contamination, such as could be statically charge or made of a material which may hold contaminated dust, pieces etc. if contacted such to limit contamination. In some embodiments, the barrier may be made as the same piece as the modules, or may be another piece inserted prior or after the substrate may be placed on the module. In some embodiments, the barrier may be a separate piece or material, made at a different time than the modules.

Figure 3:
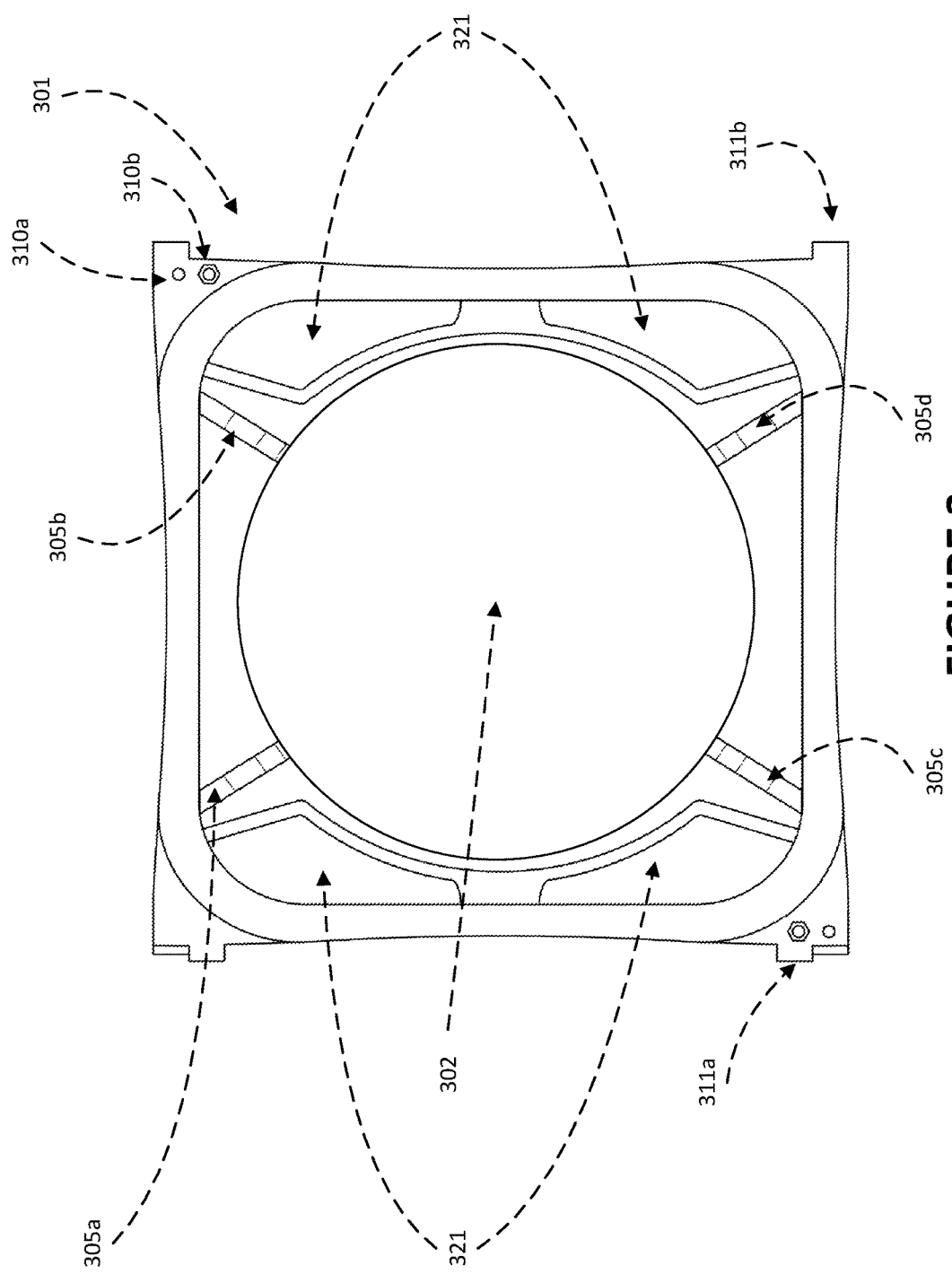
FIG. 3 may be a top down view of one embodiment of the present invention substrate holder individual module with a substrate.

It may be especially noted that the shapes used for the substrates, modules, and stack are a preferred embodiment, but in other embodiments the shapes, design, sizes and stacking method may be of any type plurality or design, FIG. 3 may be a top down view of one embodiment of the present invention substrate holder individual modules with a substrate.

FIG. 3 teaches to a substrate module 301, of which may hold a substrate 302. The substrate 302 may be positioned on arms 305*a*, 305*b*, 305*c* and 305*d*. It may be noted that in other embodiments there may be any other plurality of arms, in any location.

Additional the substrate module 301 may also include guides or latches 311*a* and 311*b* along the exterior, top, and bottom sides of the module, such that guides may interface with the below or above modules such that the modules when stacked are secured or interact such that the stack does not fall or become misaligned. The guides or latches may be of any type, but in a preferred embodiment may be wherein an extrusion of one module fits into a recess in the below or above module, such that the two modules become able to resist lateral movement. It may be noted that the guides or attaches may be of any plurality, and on any side of the module.

Also, noted may be that within the modules there may be extrusions 310*a* and recesses 310*b*. The extrusions 310*a*, may extrude into corresponding recess on the above, or on the below module, such that every above and below module may be connected by the extrusion and recess mounting. The extrusion and recesses may be of any plurality and may be on any side, or location on the module. These extrusions may also aid in the self-centering and self-aligning ability of each module with the below or above module, as well as aid in the ability to resist lateral movement and de-alignment. The extrusions may also provide for the ability for gas to flow within the pieces, such that gas may flow between the modules. In addition, the extrusions and recesses may aid in distributing gas to the modules and substrates in any fashion, such that the air may be provided to each substrate in a laminar fashion such as in FIG. 8B.

In addition, FIG. 3 shows a top down view of the purge gas distribution channels 321, of which one side may be a supply and one side may be a removal or collector or may be diagonally opposite, among any other designs or combination. It may be noted that the channels may be of any plurality, any size and design as shown, or as one skilled in the art would foresee. In addition, the channels may aid in distributing gas to the substrates in any fashion, such that the air may be provided to each substrate in a laminar fashion such as in FIG. 8B.

Figure 4:
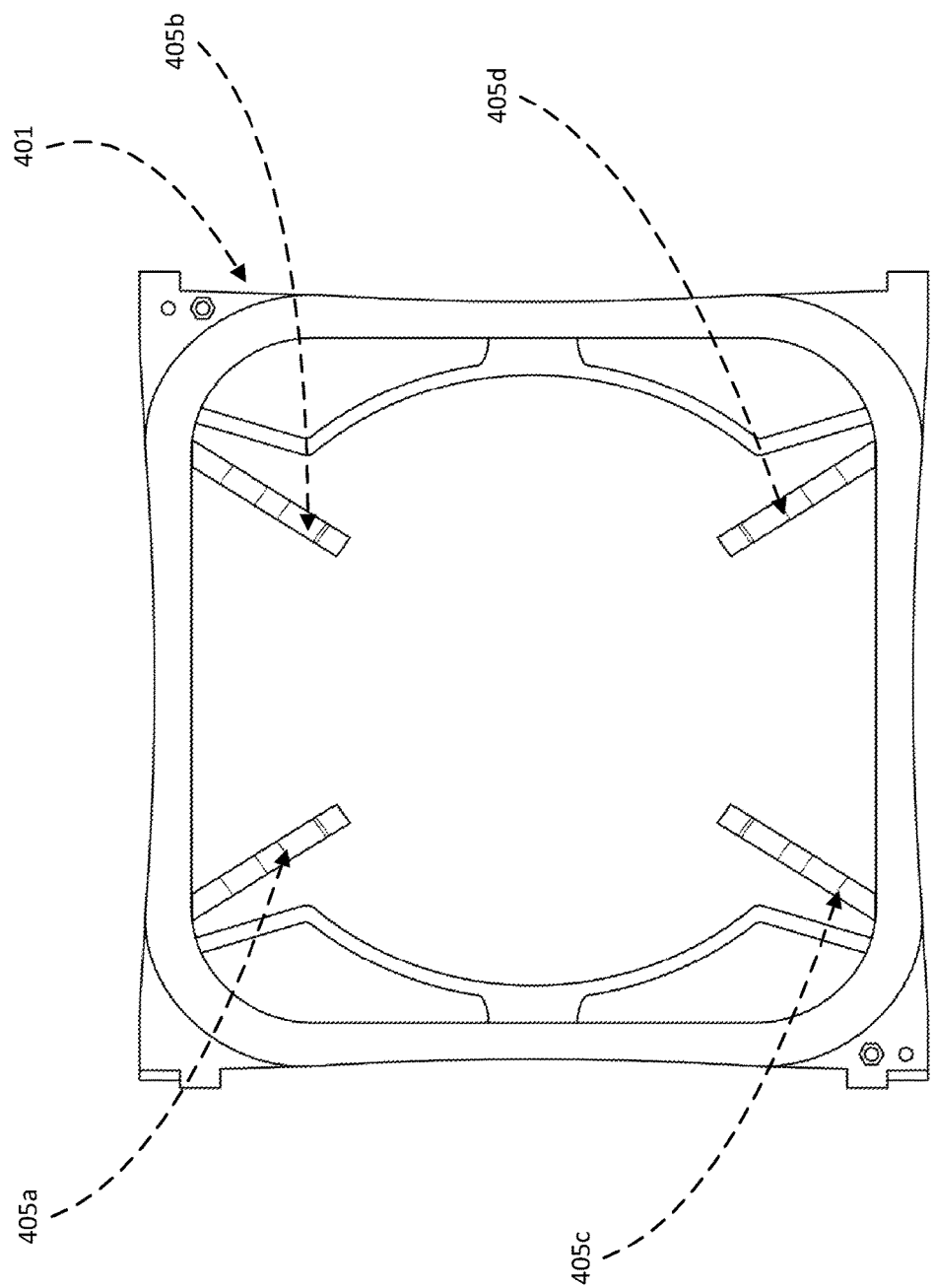
FIG. 4 may be a top down view of one embodiment of the present invention substrate holder individual module without a substrate.

FIG. 4 may be a top down view of one embodiment of the present invention substrate holder individual module without a substrate. It may be noted that may be similar to FIG. 3, but without the substrate.

FIG. 4 teaches to a module 401, with substrate holding arms 405*a*, 405*b*, 405*c* and 405*d*, of which may extrude into the center of the substrate holder. It may be noted that the length of arms may be of any length. It may be also noted that in a preferred embodiment, the arms may be made in single mold or piece with the holder, such that the length are fixed, but in other embodiments the arms may be adjustable via a hanger or extension. It may be also noted that the length may be determined by the intended substrate size.

Figure 5:
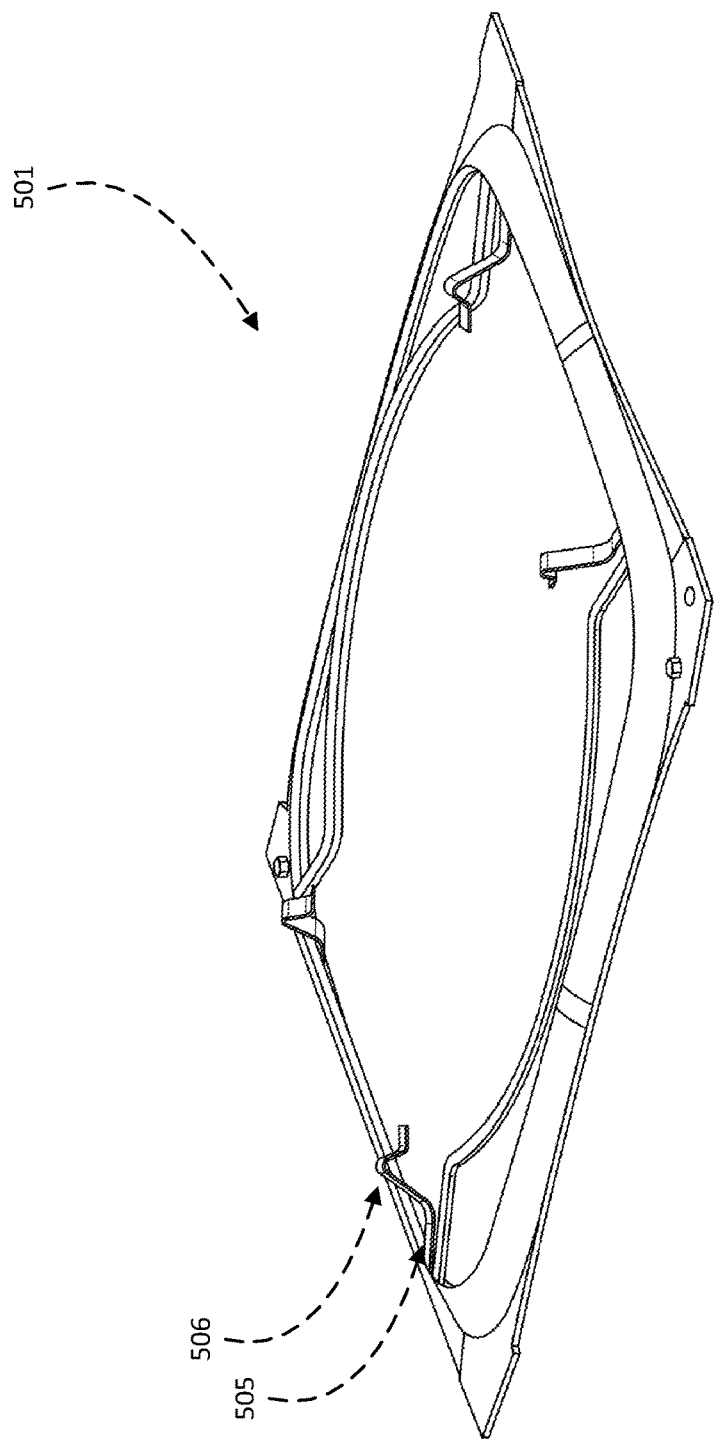
FIG. 5 may be a perspective view of one embodiment of the present invention substrate holder individual module without a substrate.

FIG. 5 may be a perspective view of one embodiment of the present invention substrate holder individual module without a substrate.

FIG. 5 teaches to a substrate holder 501, of which may be noted may be the same as found in FIG. 3 and FIG. 4.

FIG. 5 teaches to the substrate holder having the substrate arms, wherein in the perspective view it may be easily seen the substrate holding arms 505 are present. In the perspective view it can be seen that the arm 505, arches upward at point 506, and include a notch at a higher point than the connection point of the arm to the holder body. It may be noted that the angle, length and degree of the arch and notch in relation to the holder body may be of any characteristic. It may be also noted that when stacked, the above or below holder and substrate, via the arm, may be offset from the substrate below, such that the substrates do not touch, or contaminate each other, and such that a small distance, such as 0.5 mm may be held between the substrate. It may be also noted that the arches allow for the substantial weight of the stack to be transferred between holder body to holder body, and not through the substrates or arms themselves.

Figure 6:
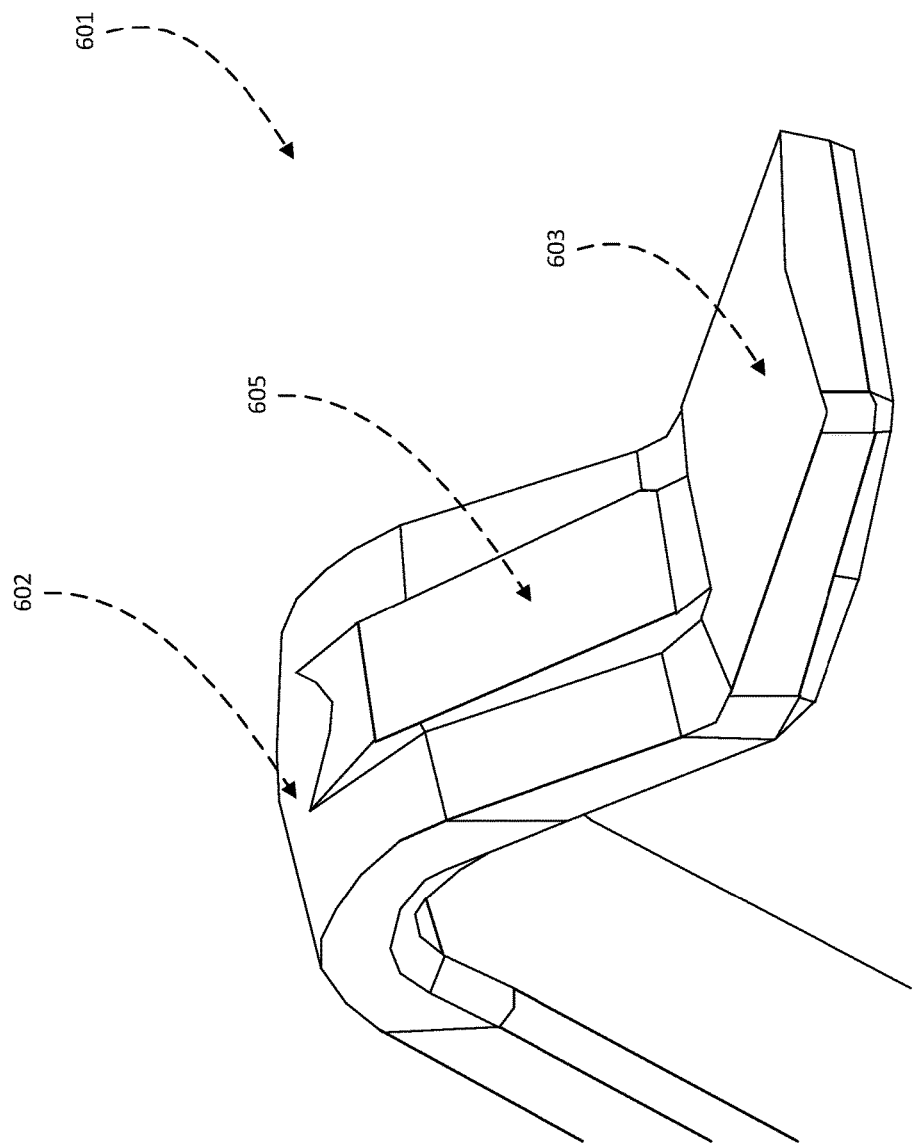
FIG. 6 may be a close up sectional view of one embodiment of the present invention substrate holder's substrate holding arm.

FIG. 6 may be a close up sectional view of one embodiment of the present invention substrate holder's substrate holding arm.

FIG. 6 displays a section of the substrate holder arm 601. The embodiment teaches to the arm 601, as aforementioned, including an excusing arch 602 and notch 603. It may be noted that the arch 603 may be of any angle, degree or length, and that the notch may be of any length. Included may be a slight extrusion 605 of which may aid the substrate from being moved, jostled, or otherwise inadvertently or advertently removed from sitting on the notch 603, of which will be further detailed in FIG. 7.

Figure 7:
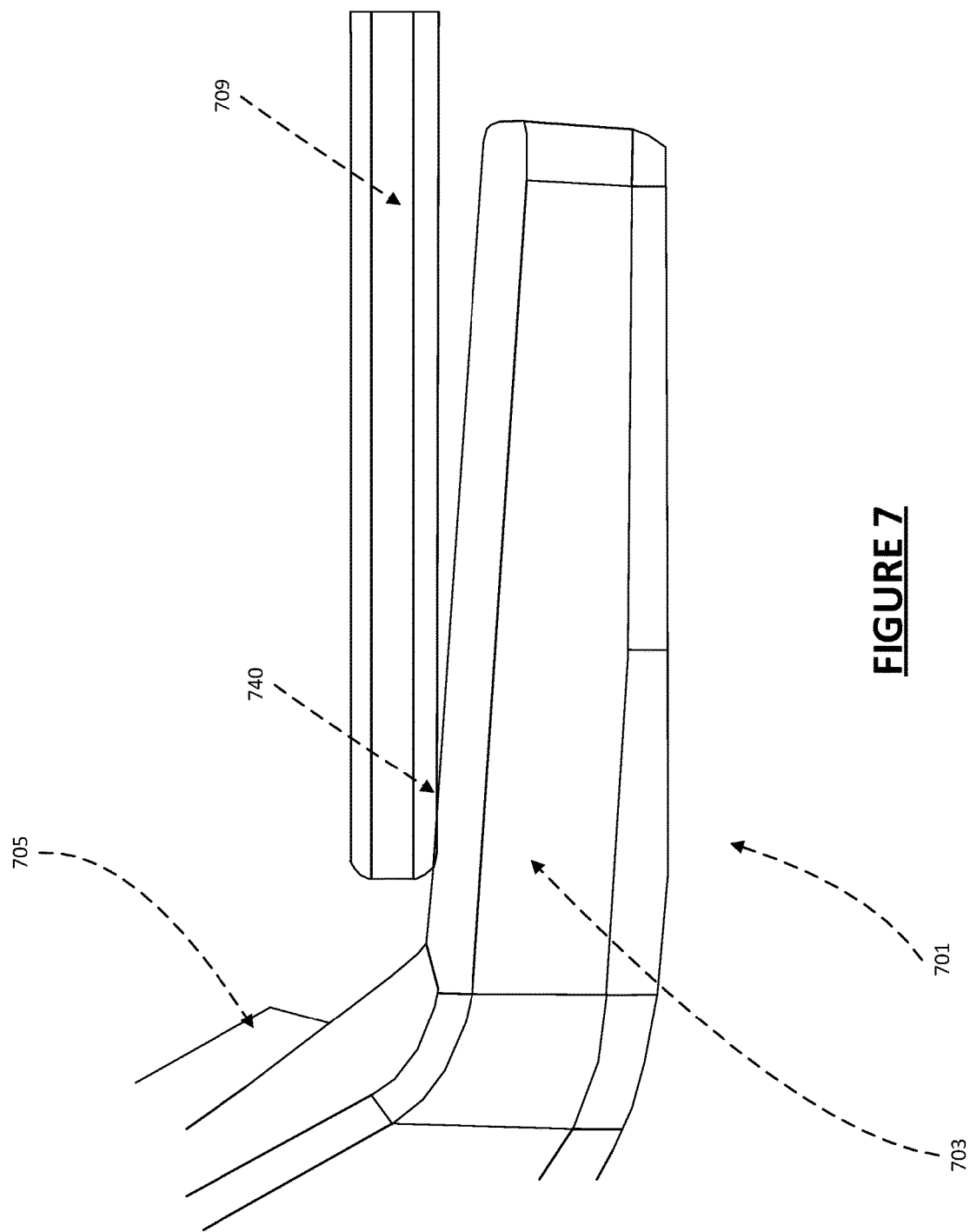
FIG. 7 may be a close up side sectional view of one embodiment of the present invention substrate holder's substrate holding arm with a substrate.

FIG. 7 may be a close up side sectional view of one embodiment of the present invention substrate holder's substrate holding arm with a substrate present.

FIG. 7 teaches to the substrate holder arm 701, wherein a substrate 709 may be held. It may be noted that the notch 703, of which the substrate may be directly in contact with may be angled downward in respect to the rest of the arm 701 structure, as well as the substrate. This makes the contact point 740, the smallest possible, reducing chafing, contamination on the substrate, and allows the contact patch 740 to be at the furthest edge of the substrate, such that the substrate's surface may be able to be or may be not likely to be contaminated or in contact with the substrate arm at any other point. It may be also noted that the slot extrusion 705 may be pictured of which extrudes from them main arm structure, such that if the substrate may be moved, jostled or inadvertently removed, the notch will heed the substrates ability to fall or otherwise be dispositioned from the substrate holding arms.

Figure 8A:
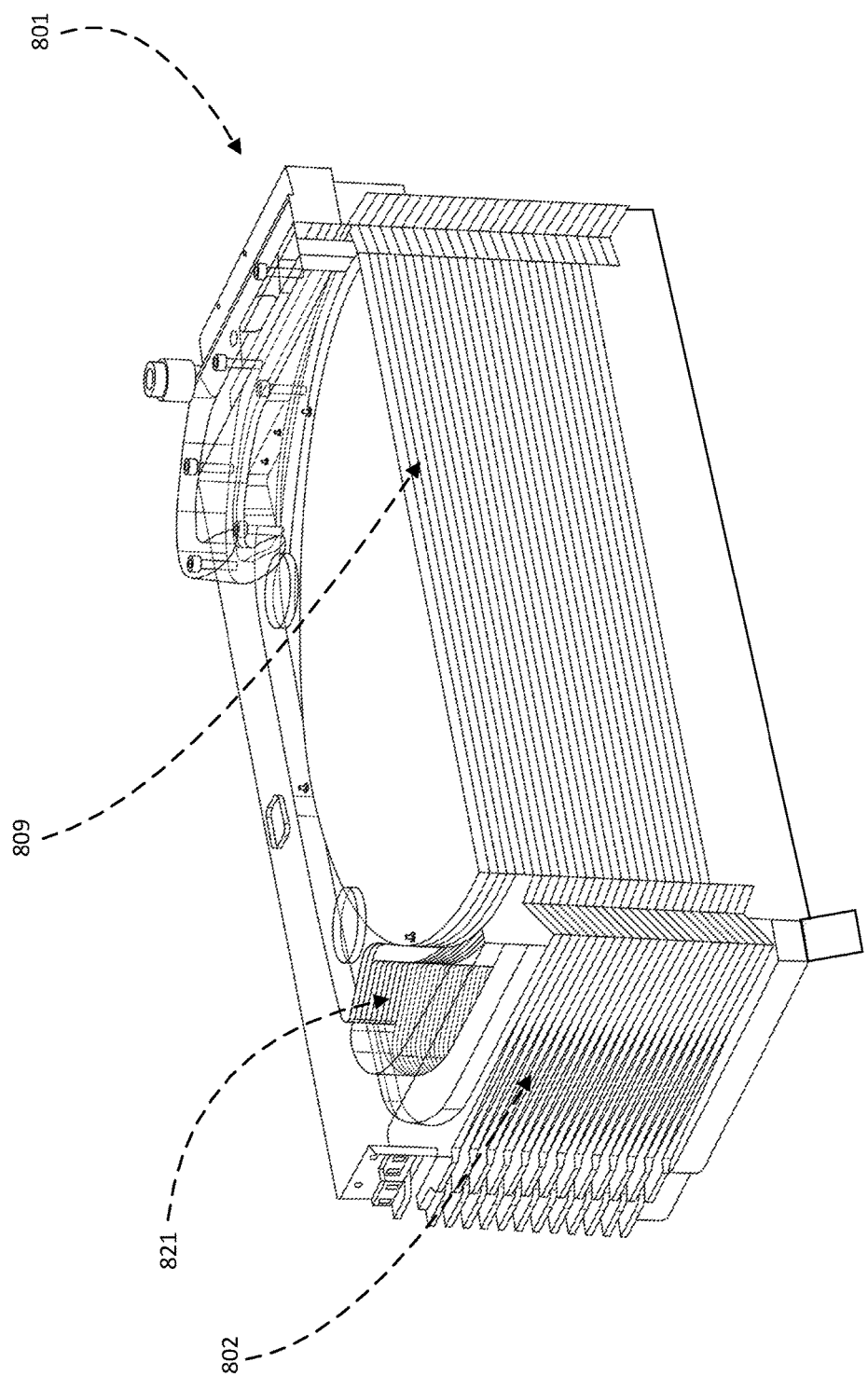
FIGS. 8A and 8B are a cross-sectional perspective views of one embodiment of the present invention substrate holder with multiple modules.
Figure 8B:
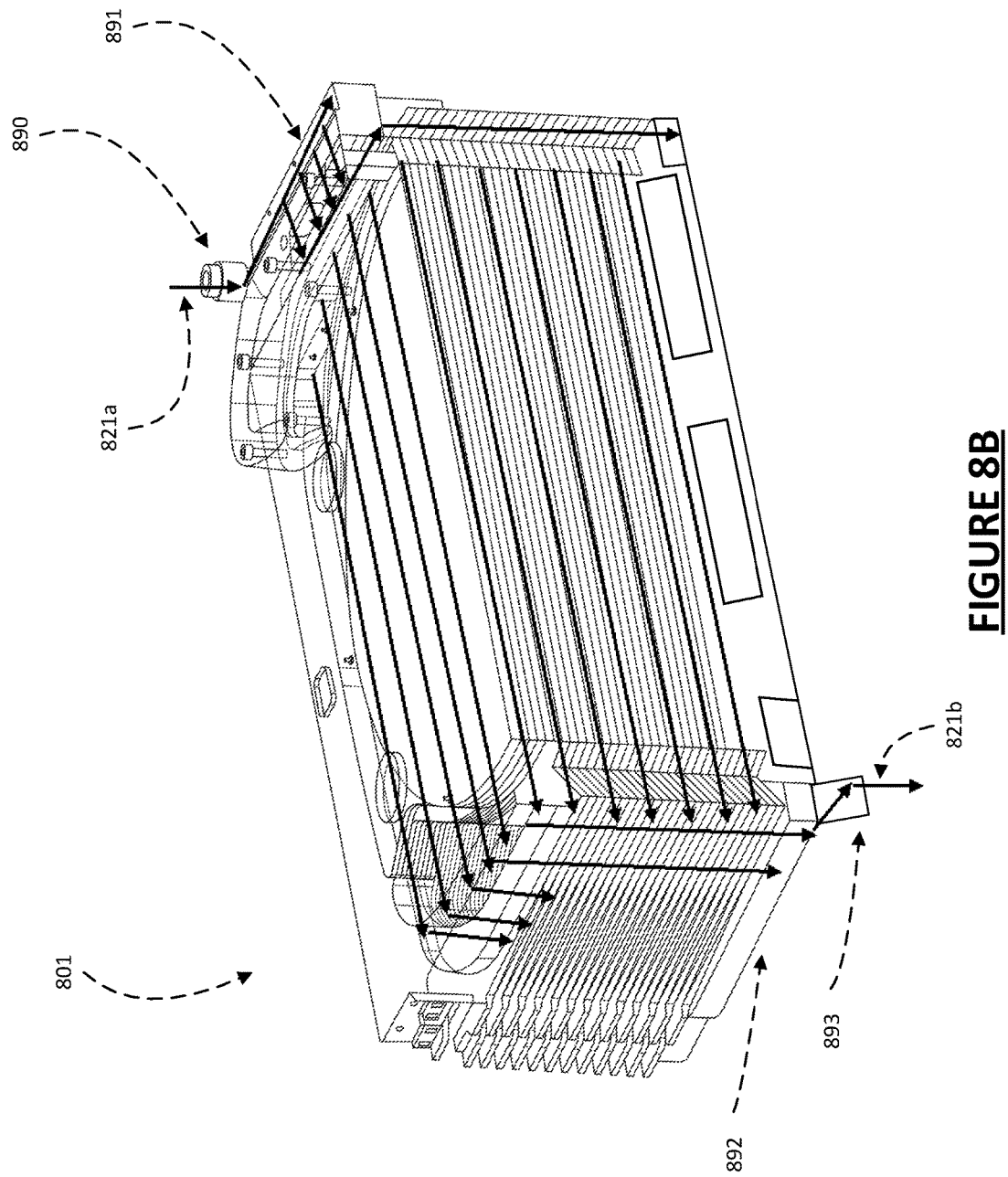

FIGS. 8A and 8B are a cross-sectional perspective views of one embodiment of the present invention substrate holder with multiple modules.

FIG. 8A specifically may provide a description for an embodiment of the present invention 801 to have multiple stacks of modules 802, wherein the modules may include multiple substrates or products 809, and that the modules and products or substrates may be stacked within the present invention in a limited space configuration, such that the present invention may store or house many substrates or products in a limited space, and wherein the substrates and modules are centered and aligned. It may be noted that the modules may be designed such that air or gas may flow through channels such as channel 821 throughout the stocker, holder storage, etc.

FIG. 8B specifically may provide an overview of an example embodiment with an example gas flow diagram. It may be noted that the gas flow, including the associated structures, while specifically stated as a preferred embodiment as shown and disclosed, may also be provided in different structures, shapes or flow directions, as the embodiment sees fit. In this preferred embodiment, the gas 821a may enter into inlet 890, and then enter into gas distribution channels 891, which then may be distribution in a latitude and longitude direction across the side gas flow buffer panel, of which may in other embodiments, may be on any side. The gas flow may then permeate and travel throughout the present invention, and provide for a laminar and even flow across the products or substrates and modules as aforementioned, to interact with the product and to perform a function such as cleaning processing etc. The gas flow may then enter the gas flow exiting recess 892, where then the gas flow may be pushed into the gas outlet 893 and may exit the present invention as gas 821b. The gas 821b may be then contaminated and further processed, released, reused and recycled, etc.

Figure 9:
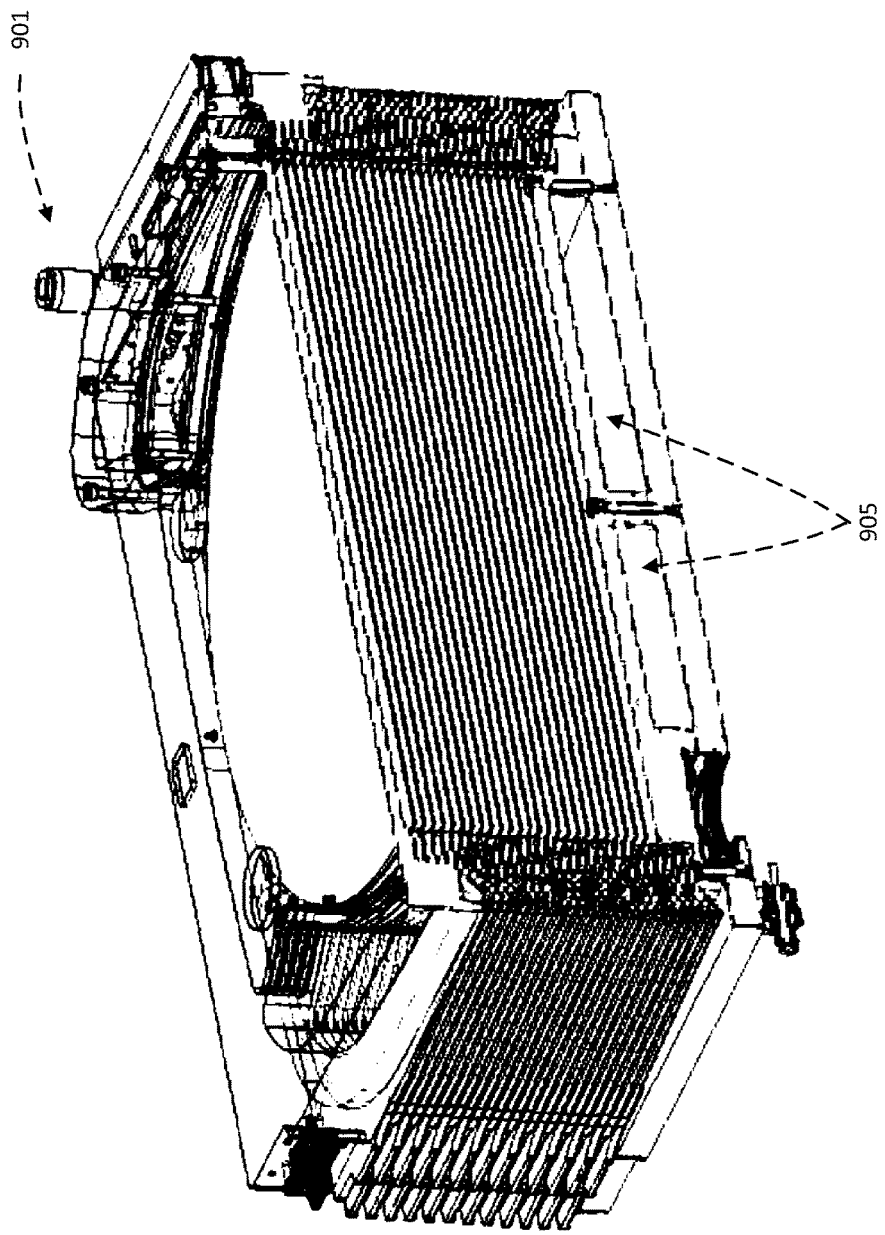
FIG. 9 may be a cross-sectional perspective views of one embodiment of the present invention substrate holder with multiple modules.

FIG. 9 may be a cross-sectional perspective views of one embodiment of the present invention substrate holder with multiple modules. Within the figure present invention 901 provides for a further detailed computer module of the disclosure of the view as found in FIG. 8, and provides for additional recesses and details for the structure of the present invention. This includes recesses 905 of which may provide for an air recess for exhaust or entry gasses of which may then travel through the internal recesses to provide laminar flow to the substrates.

Figure 10:
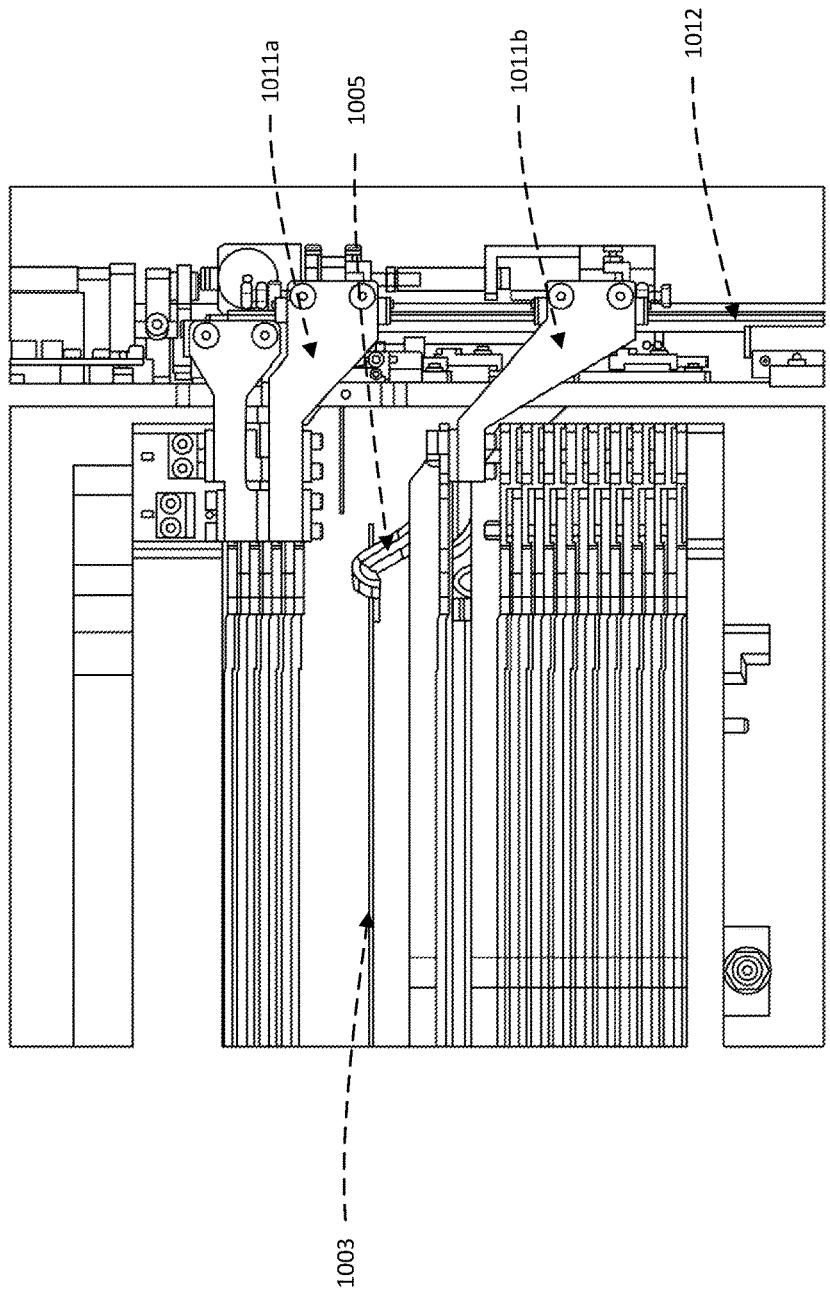
FIG. 10 may be a cross-sectional perspective view of one embodiment of the present invention substrate holder with multiple modules, including movement mechanisms.

FIG. 10 may be a cross-sectional perspective view of one embodiment of the present invention substrate holder with multiple modules, including movement mechanisms, of which may include at least one arm 1011a, of which may interact with the modules or ring of the present invention, but also may include multiple arms such as arm 1011b, of which may interact with the same module, or other modules. It may be noted that the arms may interact with separate, the same or any plurality and combination of modules, as well as interact with the substrates themselves. It may be noted that the view only displays one corner of the present invention, and similar arms and structures may be found at another corner of the invention, at every corner of the invention, or in some corners there may be the active components, such as motors, and wherein some matching corners may then have passive components which aid the active components in moving removing placing or otherwise interacting with the products, substrates or modules. The arms may travel across and up and down the present invention such as on a pneumatic slide, but also may be by any method such as a conveyor or band and gear method, among others. The arms may then have aforementioned substrate or product holding arms 1005, which may aid in holding and self-centering or aligning the products or substrates 1003.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It may be appreciated that the various systems, methods, and apparatus disclosed herein may be embodied in a machine-readable medium and/or a machine accessible medium compatible with a data processing system (e.g., a computer system), and/or may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate manufacturing, processing, or transfer system, the system comprising:
a substrate handling system including one or more holders; wherein
each of the one or more holders:
is stackable;
includes one or more holding arms that extend into a center interior recess of the holder such that the holder holds a substrate via the one or more holding arms;
holds the substrate such that there is a separation between each of a plurality of substrates when a plurality of holders are stacked;
is formed from one piece; and
includes an opening located between the center interior recess and an outer edge of the holder such that, when the plurality of holders are stacked, openings of the plurality of holders collectively define a purge gas distribution channel that extends vertically parallel to the center interior recess.

2. The system according to claim 1, wherein the substrates held by the holder is not clamped by the holder.

3. A substrate manufacturing, processing, or transfer system, the system comprising:
a substrate handling system including one or more holders; wherein
each of the one or more holders:
is stackable;
includes one or more holding arms that extend into a center interior recess of the holder such that the holder holds a substrate via the one or more holding arms;
holds the substrate such that there is a separation between each of a plurality of substrates when a plurality of holders are stacked;
is formed from one piece; and
is square-shaped; and
the one or more holding arms include four arms located on respective diagonal sides of the square-shaped holder.

4. The system according to claim 1, wherein
the one or more holding arms have an angled arch with a notch on an inward side of the arch; and
the notch angles downward in relation to the substrate.

5. The system according to claim 4, wherein the notch allows the substrate to be placed on the one or more holding arms such that the substrate is held by the one or more holding arms and rests on the notch.

6. The system according to claim 4, wherein the one or more holding arms position the contact patch to be on an extreme end of the substrate.

7. The system according to claim 4, wherein the one or more holding arms allow the substrate to self-center on the one or more holding arms.

8. The system according to claim 4, wherein the notch helps to self-center the substrates on the one or more holding arms.

9. The system according to claim 1, wherein
each of the one or more holders includes recesses and extrusions;
the extrusions of one holder key into the recesses of another holder, such that the plurality of holders are aided in stopping from falling or misaligning when stacked.

10. The system according to claim 1, wherein the plurality of holders self-center or self-align when stacked.

11. The system according to claim 1, wherein the plurality of holders when stacked hold the substrates at a high density.

12. The system according to claim 1, wherein the plurality of holders and the plurality of substrates are housed in a container or compartment, isolated from an environment internal to the manufacturing, processing or transfer system or an exterior ambient environment.

13. The system according to claim 1, wherein forced gas is fed through recesses in the plurality of holders and a compartment or container which is able to contact the plurality of substrates in a laminar fashion throughout the plurality of substrates and the plurality of holders when stacked, such that the plurality of substrates are treated, or kept free from contamination or damage.

14. The system according to claim 1, wherein the one piece construction of the one or more holders reduces production steps.

15. The system according to claim 1, wherein the one piece construction of the one or more holders reduces friction and contact patch between the plurality of substrates and the plurality of holders.

16. The system according to claim 1, wherein the plurality of substrates and the one or more holders have sensors and associated data tracking abilities to provide for efficient transfer, tracking and propagation of the plurality of substrates and the one or more holders, as well as exterior systems and devices.

17. A substrate manufacturing, processing, or transfer system, the system comprising:
a substrate handling system including one or more holders, wherein each of the one or more holders:
is stackable such that the system holds a plurality of substrates at a high density;
includes one or more holding arms that extend into a center interior recess of the holder such that the holder holds a substrate via the one or more holding arms; and
is squared-shaped;
the one or more holding arms:
include four arms located on respective diagonal sides of the square-shaped holder; and
have an angled arch with a notch on an inward side of the arch, the notch angles downward in relation to the substrate such that the substrate is held by the one or more holding arms and rests on the notch, making the smallest contact patch and self-centering the substrate;
each of the one or more holders holds the substrate such that there is a separation between each of the plurality of substrates when a plurality of holders are stacked;
each of the one or more holders is formed from one piece; and
each of the one or more holders does not clamp the substrate.

18. The system according to claim 17, wherein each of the one or more holders includes recesses and extrusions, wherein
the extrusions of one holder key into the recesses of another holder, such that the plurality of holders are aided in stopping from falling or misaligning when stacked, and such that the plurality of holders self-center or self-align when stacked.

19. The system according to claim 17, wherein the plurality of holders are able to direct forced gas fed through recesses so as to contact the substrates in a laminar fashion throughout the plurality of holders and the plurality of substrates when stacked, such that the plurality of substrates are treated, or kept free from contamination or damage.

* * * * *